United States Patent
Sengupta et al.

(10) Patent No.: US 6,228,757 B1
(45) Date of Patent: May 8, 2001

(54) PROCESS FOR FORMING METAL INTERCONNECTS WITH REDUCED OR ELIMINATED METAL RECESS IN VIAS

(75) Inventors: Samit Sengupta; Tammy Zheng, both of San Jose, CA (US)

(73) Assignee: Philips Semiconductors, Inc., Tarrytown, NY (US)

( * ) Notice: Subject to any disclaimer, the term of this patent is extended or adjusted under 35 U.S.C. 154(b) by 0 days.

(21) Appl. No.: 09/035,735

(22) Filed: Mar. 5, 1998

(51) Int. Cl.[7] .................. H01L 21/4763; H01L 21/44
(52) U.S. Cl. .................. 438/622; 438/625; 438/636; 438/637; 438/643; 438/669; 438/627
(58) Field of Search ................... 438/636, 637, 438/638, 642, 643, 644, 648–652, 653, 654, 669, 686, 687, 688, 625, 634, 639, 253, 254, 255, 396, 397, 398, 622

(56) References Cited

U.S. PATENT DOCUMENTS 5,242,861 * 9/1993 Inaba ....................... 438/627
5,656,543 * 8/1997 Chung ..................... 435/625
5,877,082 * 3/1999 Kimizuka et al. ............ 438/625

* cited by examiner

Primary Examiner—Charles Bowers
Assistant Examiner—Thanhha Pham

(57) ABSTRACT

A process for manufacturing a semiconductor device having metal interconnects reduces or eliminates the recessing of metal in the vias, particularly when the metal in the vias is aluminum or an aluminum alloy. The process includes forming a via in a device layer of the semiconductor device. A barrier layer is formed over the device layer and a metal layer is formed over the barrier layer. The metal layer also fills the via to form a via structure. A portion of the metal layer is then removed and a remaining portion of the metal layer forms a conductive structure having a sidewall extending from a surface of the barrier layer. A spacer is formed along the sidewall of the conductive structure and a portion of the barrier layer is removed using the spacer to protect the via structure adjacent the surface of the device layer. In particular, the spacer protects a portion of the via structure that does not overlap with the conductive structure.

23 Claims, 10 Drawing Sheets

PROCESS FOR FORMING METAL INTERCONNECTS WITH REDUCED OR ELIMINATED METAL RECESS IN VIAS

FIELD OF THE INVENTION

The present invention is, in general, directed to a process for making a semiconductor device. In particular, the present invention relates to a process for making a semiconductor device having overlapping interconnects, in which the production of recesses in the interconnects is prevented or reduced.

BACKGROUND OF THE INVENTION

Over the last few decades, the electronics industry has developed semiconductor technology to fabricate small, highly integrated electronic devices. Many semiconductor devices are now formed by vertical stacking of device layers, including multiple layers of conductive lines with interconnects between layers. As these devices become smaller, there is a need for increasingly narrow conductive lines and interconnects to form circuit pathways within these devices. These conductive lines and interconnects are typically formed using metals, including, for example, aluminum, tungsten, and copper.

In a multilevel architecture, layers of metal conductive lines which define circuit pathways are separated from each other by interlevel dielectrics. In a typical process scheme, a first metal layer is deposited and patterned to form a first set of conductive lines. This is followed by deposition of a dielectric layer over the first set of conductive lines. Vias are etched through the dielectric layer to the underlying conductive lines and then filled with metal to establish interlayer conduction. In conventional processing methods, the metal which fills the vias typically extends beyond the via when deposited. This excess metal is removed by, for example, chemical-mechanical polishing or etch back. A second metal layer may then be formed over the dielectric layer and patterned into a second set conductive lines.

With current aggressive design rules, it is not always possible to have complete overlap of conductive lines with underlying vias. This typically leaves at least a portion of the vias exposed during the etch process in which second set of conductive lines are patterned. A recess in the exposed portion of the vias may be formed during this process. For example, if an aluminum conductive line is formed over the via and the aluminum conductive line does not completely overlap the underlying via, then there is a possibility that a portion of the via may be etched during the formation of the conductive lines, which typically includes one or more metal etching steps.

Tungsten is used to fill the vias in order to reduce the amount of recessing during subsequent processing steps. Tungsten-filled vias provide adequate selectivity during metal etching steps. However, the presence of tungsten in the path of current flow may lead to flux divergence in the metal lines at the tungsten/metal interfaces resulting in the degradation of the electromigration resistance.

To address this issue, aluminum and aluminum alloys have been suggested for incorporation in the vias. In addition to reducing via resistance, aluminum vias may also show better electromigration resistance. The use of aluminum in vias is expected to become more important as the device dimensions become smaller. Conventional techniques include filling the vias with tungsten or aluminum, polishing or etching back the tungsten or aluminum to remove excess deposits outside of the via, and then depositing a second metal layer for making the conductive lines.

When aluminum is incorporated in the vias, a conventional metal etch technique cannot be used to form the conductive lines, which are also typically aluminum, because the aluminum in the vias may be exposed to metal etchants which may create recessing in the vias. This recessing can lead to electromigration failure. Furthermore, recesses in the vias may trap chemicals or gases during subsequent processing steps. These chemicals and gases may lead to device degradation over time. In addition, the effective thinning of the via due to the presence of the recess increases the current density through that portion of the via which may lead to local overheating and electromigration. Thus, there is a need for an improved method for forming vias and conductive lines in a semiconductor device to prevent the formation of recesses in non-overlapping portions of the via during processing.

SUMMARY OF THE INVENTION

Generally, the present invention relates to a process for manufacturing a semiconductor device having metal interconnects. The process reduces or eliminates the recessing of metal in the vias, particularly when the vias are formed using aluminum or an aluminum alloy. One embodiment is a method for producing a semiconductor device. A via is formed in a device layer of the semiconductor device. A barrier layer is formed over the device layer. A metal layer is formed over the barrier layer and also fills the via to form a via structure. A portion of the metal layer is removed and a remaining portion of the metal layer forms a conductive structure having a sidewall extending from a surface of the barrier layer. A spacer is then formed along the sidewall of the conductive structure and a portion of the barrier layer is removed using the spacer to protect a portion of the via structure adjacent the surface of the device layer.

Another embodiment is a method for producing a semiconductor device. A via is etched in a dielectric layer of the semiconductor device. The via has a sidewall and a bottom surface. A barrier layer is deposited on the surface of the dielectric layer and on the sidewall and the bottom surface of the via. A metal layer is formed over the barrier layer and fills the via to form a via structure. An anti-reflective coating (ARC) layer is formed over the metal layer and a photoresist layer is formed over the anti-reflective coating layer. A pattern is formed in the photoresist layer and portions of the anti-reflective coating layer and the metal layer are removed to expose the barrier layer according to the pattern. A remainder of the anti-reflective coating layer and the metal layer form a conductive structure having a sidewall extending from a top surface of the barrier layer. The conductive structure and the barrier layer are covered with a spacer material which is then etched to expose the barrier layer. A remainder of the spacer material forms a spacer on the sidewall of the conductive structure. A portion of the barrier layer adjacent to at least one of the conductive structure and the via structure is then removed with the spacer protecting the via structure adjacent the surface of the device layer.

A further embodiment is a semiconductor device made using the methods described above.

Yet another embodiment is a semiconductor device. The semiconductor device has a device layer and a via in the device layer. Metallic material is disposed in the via. A conductive structure is formed over the via and in contact with the metallic material. The conductive structure has a sidewall extending form the device layer. During processing the metallic material in the via is protected by a spacer formed on the sidewall of the conductive structure during the removal of a portion of a conducting barrier adjacent the via and over the device layer.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
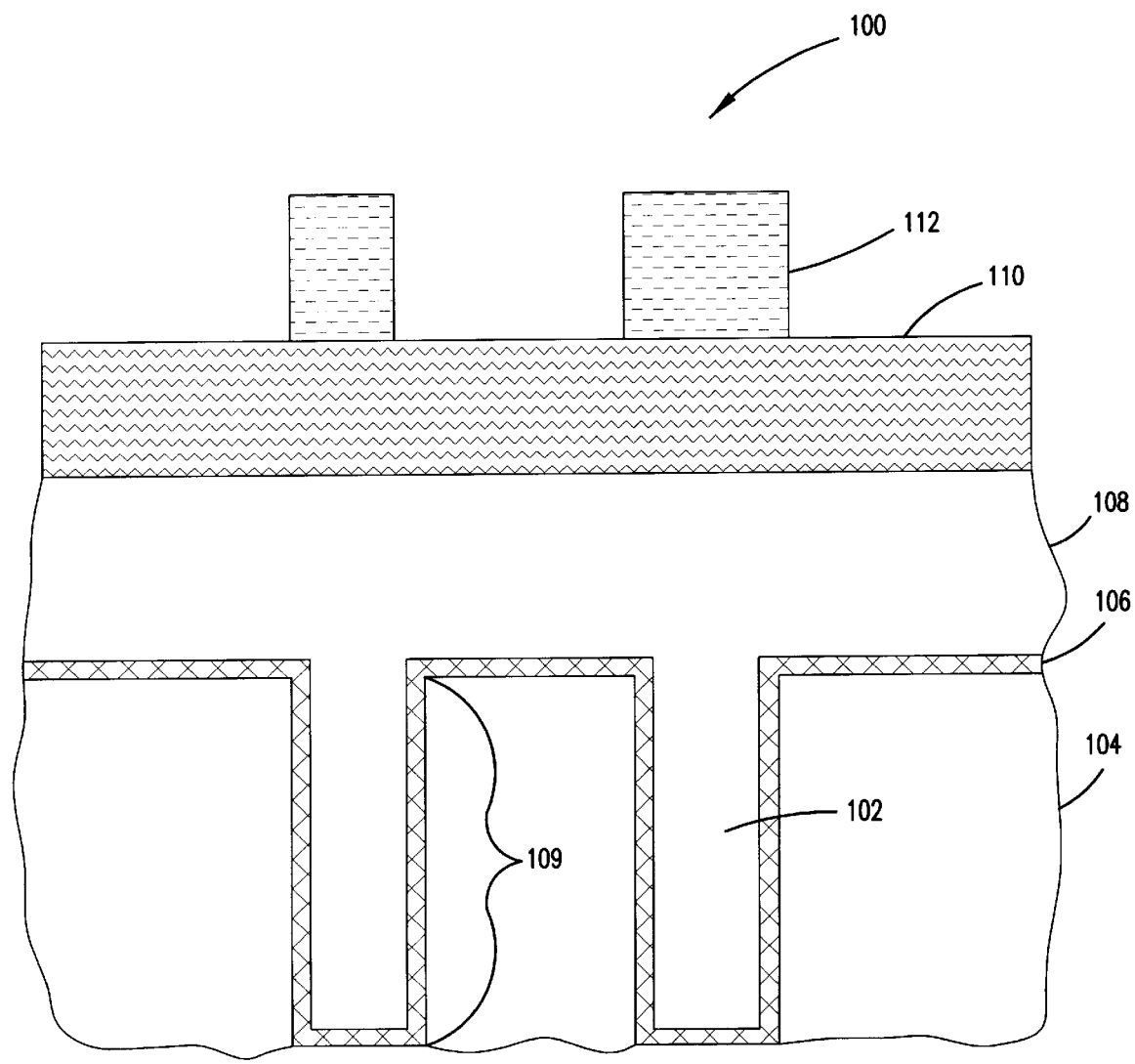
FIGS. 1A–1H illustrate, in cross-section, an exemplary fabrication process according to one example embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENT

The present invention is believed to be applicable to a number of semiconductor devices having metal interconnect structures. While the present invention may not be so limited, an appreciation of various aspects of the invention will be gained through discussion of an exemplary fabrication process in connection with the examples provided below.

FIGS. 1A–1H illustrate an exemplary process for forming metal interconnects. The process begins by forming at least one via 102 in a device layer 104 of a semiconductor device 100. Typically, the device layer 104 is made from a dielectric material. Examples of dielectric materials include silicon dioxide, silicon oxynitride, silicon oxyfluoride, silicon nitride, other oxides and nitrides, amorphous carbon, spin-on glasses (e.g., silicates, siloxanes, hydrogen silsesquioxane, and alkyl silsesquioxanes), polymers (e.g., polyimides and fluoropolymers), and other non-conductive materials. The device layer may, however, be any other layer of a semiconductor device through which a via 102 is formed.

The vias 102 may be formed by a variety of techniques. Examples of a suitable techniques include etching processes, such as, for example, wet etching, dry etching and plasma etching. Plasma etching techniques are particularly useful because of their anisotropic behavior. These techniques are well known for forming vias 102 or other trench-like structures in a semiconductor device 100. One example of such a technique includes applying a photoresist over the device layer and patterning the photoresist according to the desired via pattern. Material from the device layer 104 may then be removed by, for example, an etching process, such as an anisotropic plasma etch, to form the vias 102. The particular etchant that is used typically depends on the material of the device layer 104 and the etching process.

Often, a conductive layer (not shown) is formed prior to the device layer 104. The vias 102 typically connect conductive lines (not shown) of this underlying conductive layer to conductive lines in a metal layer 108 formed over the dielectric layer 104, as described below. Thus, the vias 102 typically extend through the device layer 104 to the underlying conductive lines.

Typical vias 102 have a diameter of, for example, 0.3 to 2.5 µm, however, vias of other sizes may also be used. The vias also typically have a cylindrical or rectangular cross-section, however, other cross-sections, including, for example, square, or ovoid, may also be used. The length of the vias varies depending on the thickness of the device layer 104 and the height of the underlying conductive lines. In some case, this length may be, for example, 0.3 to 5 µm. However, vias that are longer or shorter may also be used.

After formation of the vias 102, a barrier layer 106 may be formed over the surface of the device layer 104, as well as over the sidewalls and on the bottom surface of the vias 102. The barrier layer 106 typically protects the device layer from interaction with a subsequently deposited metal layer 108. Such interaction may include, for example, chemical reactions between the device layer 104 and the metal layer 108, as well as diffusion of metal atoms from the metal layer 108 into the device layer 104. In addition, by providing a more easily wetted surface for the metal layer 108, the use of the barrier layer 106 may improve the filling of the vias 102 by a subsequent metal layer 108, the adhesion between the device layer 104 and the subsequently formed metal layer 108, and/or the grain structure of the metal layer 108.

A variety of materials may be used to form the barrier layer 106. For example, titanium, titanium nitride (TiN), tantalum, tantalum nitride, tungsten nitride, or combinations thereof are common materials for use in forming the barrier layer 106. Other materials which are compatible with the device layer 104 and metal layer 108 may also be used. The barrier layer 106 is often formed using a material which is conductive; although typically the material of the barrier layer 106 is not as conductive as the material of the metal layer 108. If the barrier layer 106 is conductive then current can also be carried by the barrier layer 106 if the metal layer 108 formed in the vias 102 (acting as conductive lines) should fail.

The thickness of the barrier layer 106 may vary over a wide range. Typical values for the thickness of the barrier layer 106 range from 50 to 1000 angstroms.

Figure 2:
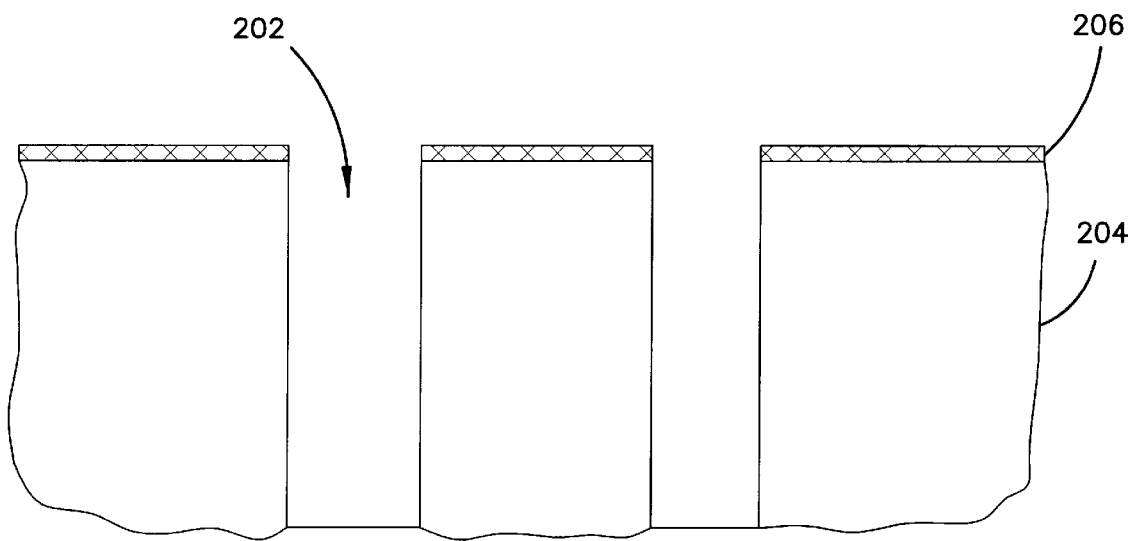
FIG. 2 is a cross-section of another example embodiment of the structure illustrated in FIG. 1A.

One alternative to this structure is illustrated in FIG. 2. In this embodiment, the via 202 is formed in the device layer 204 subsequent to the formation of the barrier layer 206 over the device layer 204. Therefore, in this case, the barrier layer 206 is not formed along the sidewalls or the bottom surface of the via 202. Subsequent processing for this structure is similar to that for the structure depicted in FIG. 1A.

In another alternative embodiment, one or more additional layers may be formed between the barrier layer and the device layer. Such layers may include, for example, passivation layers or layers which provide structural support for the subsequently deposited layers.

Returning to FIG. 1A, a metal layer 108 is formed over the barrier layer 106. The metal layer 108 also fills the via 102 to form a via structure 109. The metal layer 108 formed over the barrier layer 106 and within the via 102 may be formed in a single step. Alternatively, the via 102 may first be filled with a metal material and then, using the same or different formation conditions (e.g., deposition rate or temperature), the metal layer 108 may be formed over the barrier layer 106.

The metal layer 108 may be formed using a variety of materials. Examples of suitable materials for the metal layer 108 include metals and alloys, such as, for example, aluminum, copper, tungsten, or aluminum/copper alloys. Other conductive metals and alloys may also be used.

The metal layer 108 may be formed using a variety of techniques. Examples of suitable techniques include cold or hot physical vapor deposition (PVD), sequential CVD/PVD, low pressure PVD, and PVD followed by high pressure and/or high temperature reflow to fill the vias 102. The metal layer 108 has a thickness of, for example, 2000 to 10,000 angstroms above the device layer 104 and barrier layer 106. The thickness of the metal layer 108 over the vias will be correspondingly larger.

One advantage to this process is that the metal which fills the vias and the metal which forms the conductive lines above the vias may be sequentially deposited without an intervening polishing or etch-back step. This may reduce the number of process steps needed to form the desired structure. Conventional methods typically require that the metal for the vias and the metal for the conductive lines over the vias be deposited in different steps with an intervening polish or etch-back step.

An anti-reflective coating (ARC) layer 110 is formed over the metal layer 108 to reduce the reflection of light during a subsequent photolithographic patterning process, described below. Metals, such as aluminum, tungsten, and copper, typically have a relatively high reflectivity. Therefore, it is often necessary to provide an ARC layer with reduced reflectivity, otherwise the patterned features may be excessively broadened or narrowed. For example, in the absence of the ARC layer 110, "reflective notching" occurs when the topography of the underlying surface (e.g., a slope in the topography) causes the reflection of light at angles which are not perpendicular to the surface of the photoresist. The ARC layer 110 may also protect the metal layer 108 during subsequent processing steps, as well as provide a barrier between the metal layer 108 and subsequently deposited layers, such as a dielectric layer. In addition, the ARC layer may enhance adhesion of subsequently deposited dielectric layers.

Materials suitable for the ARC layer 110 typically have low reflectivity of light for the wavelength or wavelength range that will be used to form the pattern. Therefore, the particular materials useful for forming the ARC layer 110 depend on the size of the features and the design rules. For current 0.25 μm design rules, titanium nitride is a useful material for the ARC layer 110. Other suitable materials for the ARC layer 110 include, for example, silicon oxynitride, silicon nitride, silicon dioxide, and organic ARC materials. Although the ARC material may be non-conductive, it is often desirable to use a conductive ARC. Otherwise, the ARC material will likely need to be removed to allow connection between the conductive structures 114 (see FIG. 1C) formed from the metal layer 108 and subsequently formed interconnects or contacts.

The thickness of the ARC layer 110 is about 200 to 3000 angstroms. Often, the ARC layer 110 has an increased thickness (an additional 50 to 1000 angstroms) relative to a similar ARC layer used in conventional techniques because later processing steps typically remove portions of the ARC layer 110, as described below.

In some embodiments, an ARC layer 110 is not formed, particularly if the size of the device features is not critical or if the reflectivity of the metal layer 108 is otherwise controlled. In these embodiments, the thickness of the metal layer 108 may be increased by 50 to 1000 angstroms because subsequent processing steps may remove additional portions of the metal layer 108.

After the formation of the ARC layer 110, a photoresist layer 112 is formed over the ARC layer 110 (or metal layer 108, if an ARC layer is not used). The photoresist layer 112 is patterned, as shown in FIG. 1A, according to a desired conductive line or via pattern using, for example, photolithographic techniques. Once patterned, a portion of the photoresist layer 112 is removed according to the pattern.

Figure 1B:
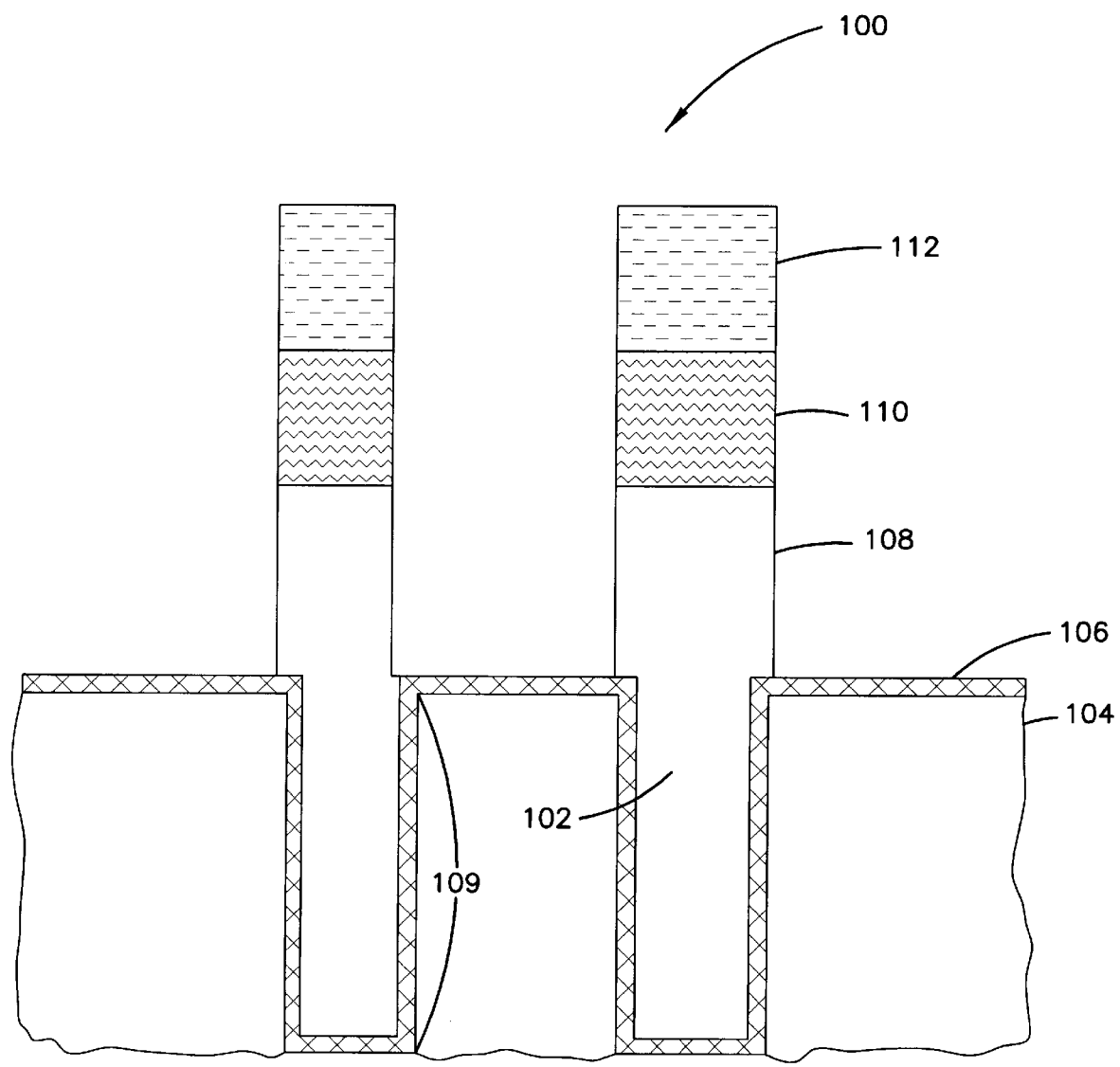

After the photoresist layer 112 has been patterned, a portion of the metal layer 108 and ARC layer 110 may be removed according to the pattern, as shown in FIG. 1B. The removal of the portion of the metal layer 108 and the ARC layer 110 may be accomplished by a variety of techniques, including, for example, wet etching, dry etching, and plasma etching. It may be desirable to use an anisotropic etching technique, such as dry plasma etching, to leave relatively straight sidewalls. Typically, the removal of the portions of the metal layer 108 and ARC layer 110 continues until the barrier layer 106 is exposed, as shown in FIG. 1B. In some embodiments, the removal process continues until all or nearly all of the barrier layer 106 between the remaining portions 114 of the metal layer 108 and ARC layer 110 is exposed. In these embodiments, the barrier layer 106 may be treated as an etch stop so that an end of the removal process is indicated when a threshold amount of the material of the barrier layer 106 is detected.

Figure 1C:
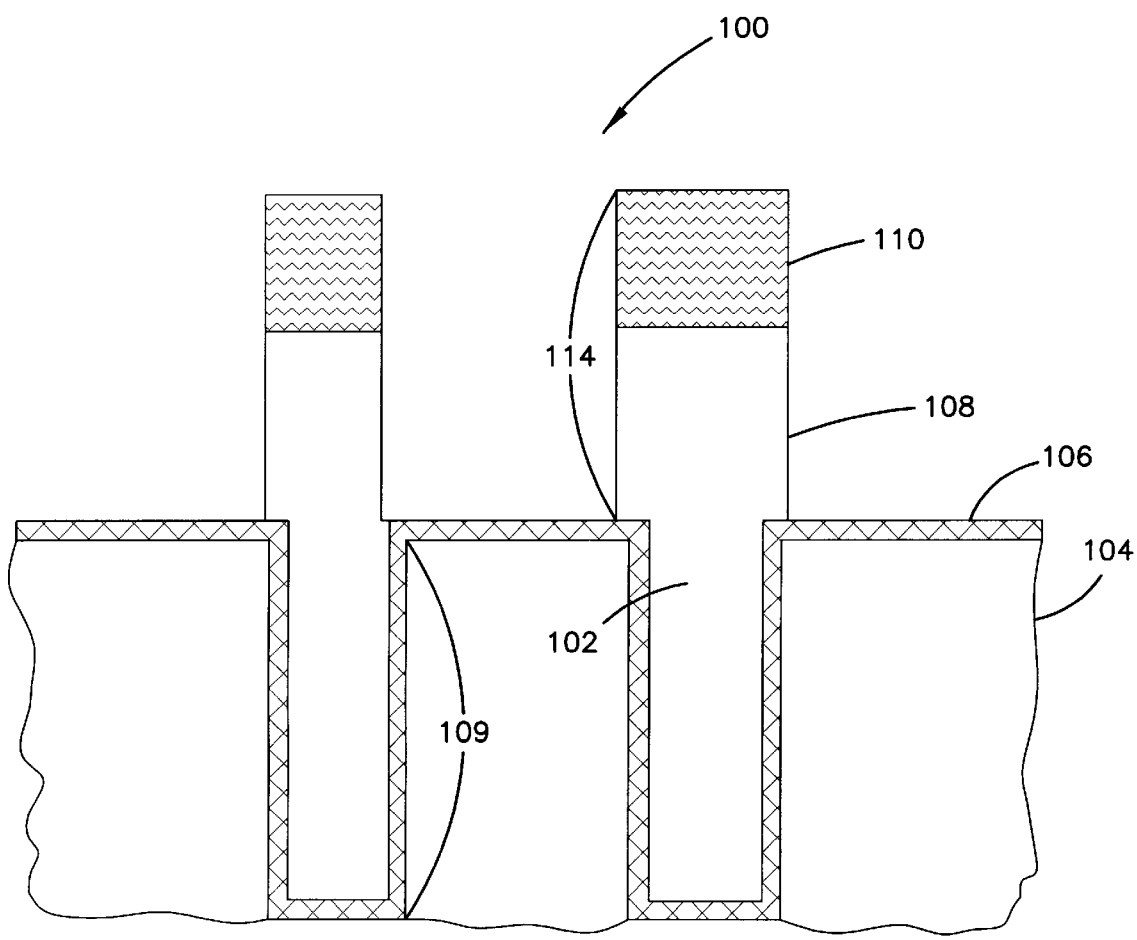

The photoresist layer 112 is subsequently removed, as shown in FIG. 1C. Removal of the photoresist layer 112 may be accomplished by a variety of techniques including, for example, selective etching or ashing (particularly if the photoresist layer is made using an organic photoresist). The remaining portions of the metal layer 108 and the ARC layer 110 form conductive structures 114 which may be used as conductive lines or vias. If an anisotropic etching technique is used to remove the portion of the metal layer 108 and the ARC layer 110, then the sidewalls of the conductive structures 114 may be covered by a protective layer formed during the etching process. This protective layer may include polymers formed by the etchant material. The protective layer can often be removed during an ashing process or by a solvent strip process.

The conductive structures 114 may or may not be aligned with the underlying via structures 109, as illustrated in FIG. 1C. It is the non-overlapping portions of the via structures 109 which are particularly susceptible to recess formation during subsequent processing in conventional fabrication processes.

Figure 1D:
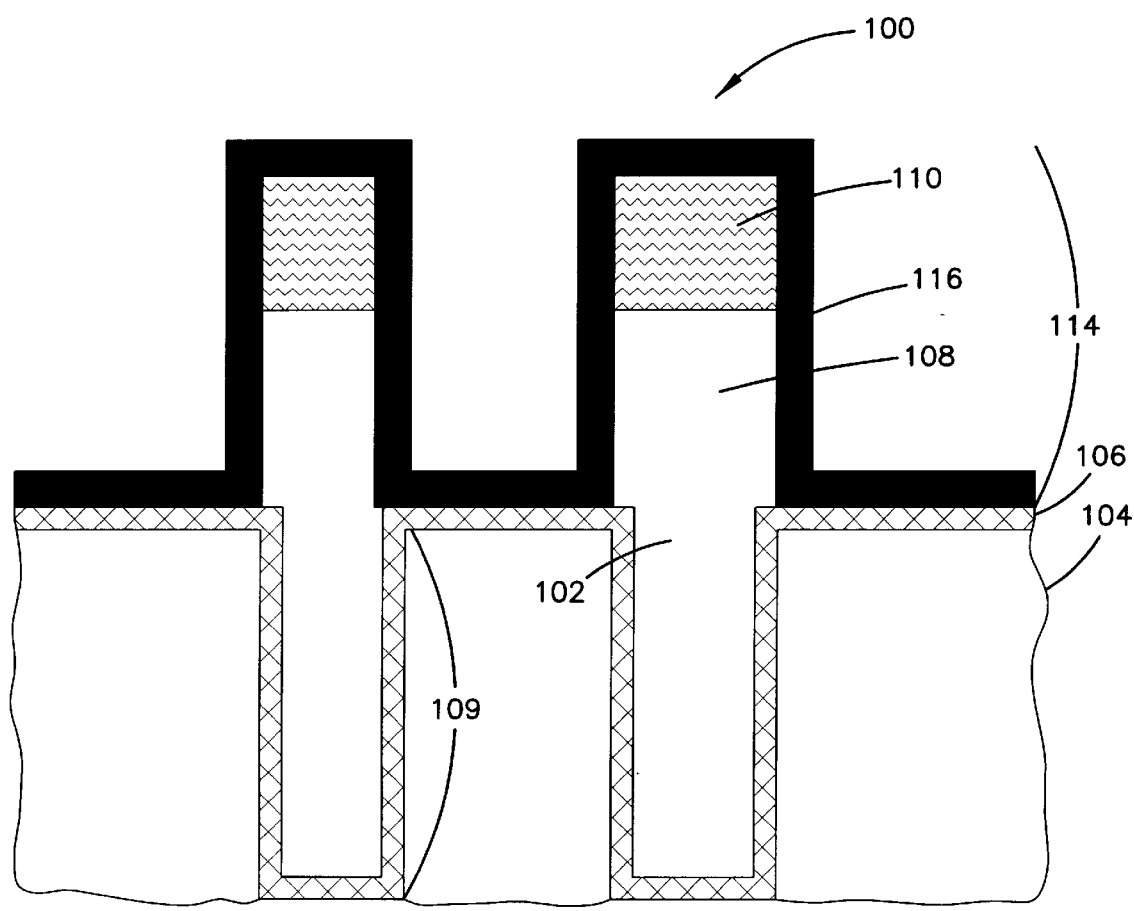
Figure 1E:
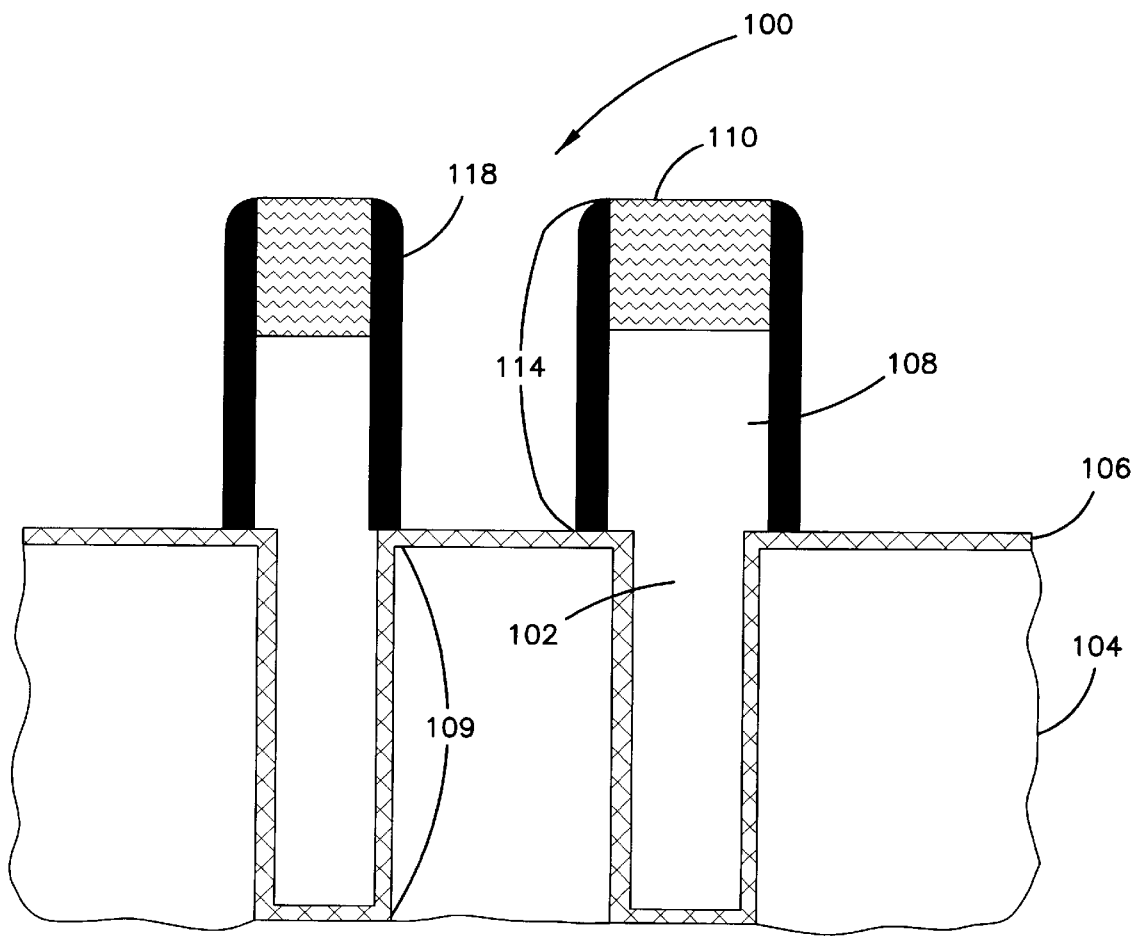

To reduce or eliminate recess formation, a spacer material 116 is subsequently deposited over the device layer 104, barrier layer 106, and conductive structures 114, as shown in FIG. 1D. The spacer material 116 is typically formed as a conformal layer over the underlying structures. The spacer material 116 may be formed by a variety of techniques including chemical vapor deposition (CVD), physical vapor deposition, or spin-on techniques. In particular, CVD is a commonly used method for forming a conformal layer over a surface having structure. The spacer material 116 may be made using a variety of materials. Oxides and nitrides, such as silicon oxide, silicon nitride, and silicon oxynitride, are often used as spacer materials 116. Photoresist compounds may also be a convenient spacer material 116 as these compound can be easily formed on the structures by a CVD process and easily removed by techniques, such as ashing.

Typically, the spacer material 116 is formed to a thickness which is at least as large as the expected maximum width of an exposed portion of the via structure 109 (i.e., the portion of the via structure 109 which does not overlap with the conductive structures 114). This maximum width may be, for example, 0.5 µm or less. Therefore, the spacer material 116 has a thickness of, for example, 0.1 µm to 0.8 µm, although larger or smaller thicknesses may also be used. An extra thickness of the spacer material 116 may be provided to compensate for the removal of portions of the spacer material 116 during the formation of one or more spacers 118, as described below and depicted in FIG. 1E. However, the thickness of the spacer is generally limited by the minimum spacing between conductive lines.

A portion of the spacer material 116 is then removed to expose the portions of the barrier layer 106 between the conductive structures 114 according to the pattern and to form spacers 118 along the sidewall of the conductive structures 114 that extends from the barrier layer 106. The spacers 118 protect the sidewall of the conductive structures 114 and the exposed portions of the via structures 109 during subsequent processing. The formation of the spacers 118 from the spacer material 116 may be accomplished by a variety of techniques including, for example, wet etching, dry etching, or plasma etching. In some embodiments, an etchant selective to the barrier layer 106 and/or device layer 104 is used. Moreover, in some embodiments, anisotropic etching methods are used to reduce etching of the spacer material 116 along the sidewalls of the conductive structures 114.

Figure 1F:
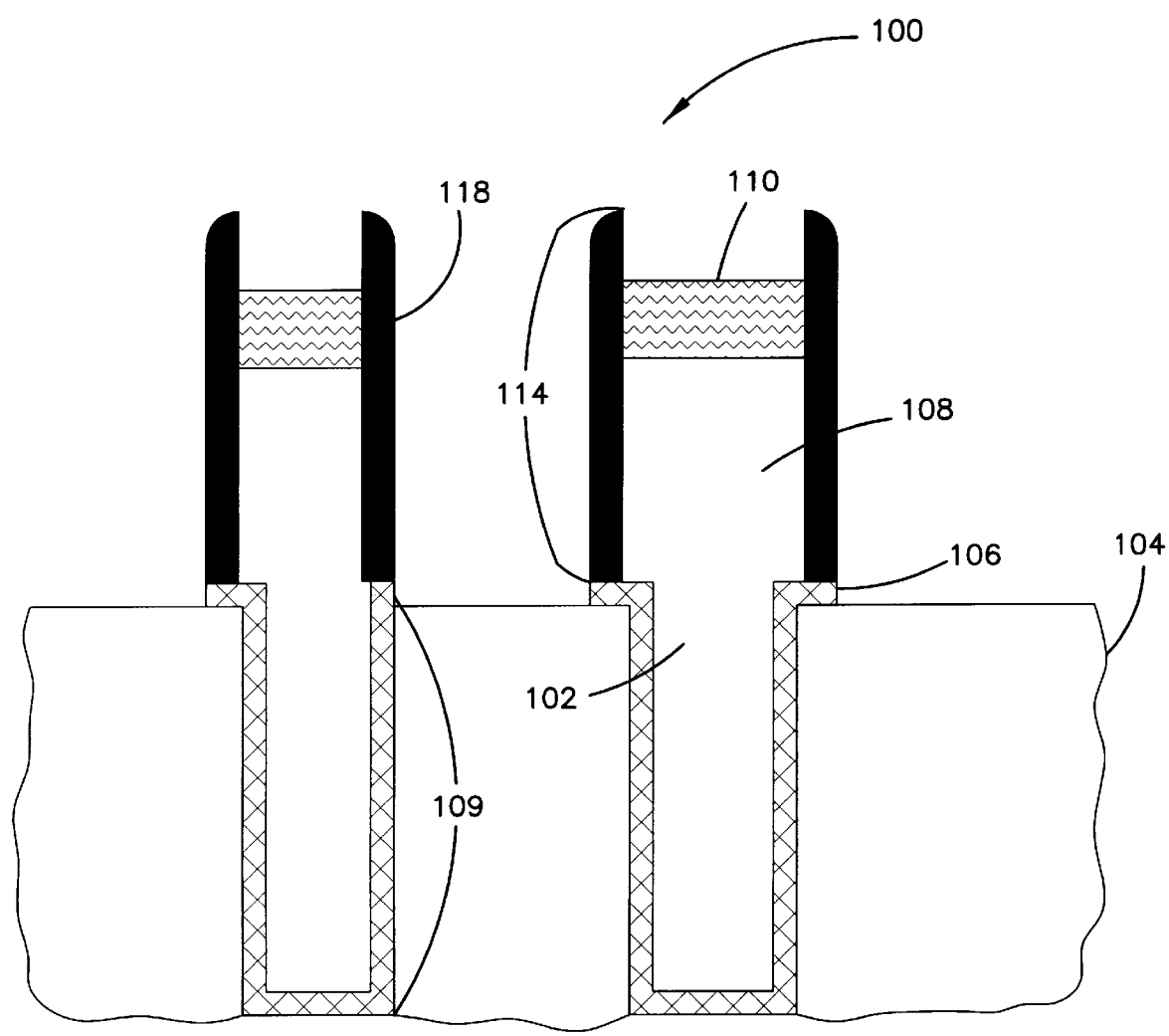

After formation of the spacers 118, a portion of the barrier layer 106, which is between or adjacent to the conductive structures 114 and not covered by the spacers 118, is removed, as shown in FIG. 1F. This electrically isolates the conductive structures 114, except at desired connecting points according to the pattern. The removal of these portions of the barrier layer 106 may be accomplished by a variety of techniques including wet etching, dry etching, or plasma etching. These techniques may use selective etchants to remove the material of the barrier layer 106. In some embodiments, the barrier layer 106 is overetched to aid in isolating the conductive structures 114 from each other (unless a connection is desired).

Often this process also removes a portion of the ARC layer 110, especially if the ARC layer 110 and the barrier layer 106 are made of the same material, such as titanium nitride. It may be desirable that at least a portion of the ARC layer 110 remains to protect the metal layer 108 during subsequent processing steps as well as to enhance adhesion between the metal layer 108 and subsequently deposited layers. Therefore, the thickness of the ARC layer 110 may be large enough that at least a portion of the ARC layer 110 remains after the removal of the barrier layer 106 from between the conductive structures 114. In these embodiments, the thickness of the ARC layer prior to the removal step is, for example, 300 to 5000 angstroms. The thickness of the ARC layer after this removal step is, for example, 200 to 3000 angstroms.

Figure 3:
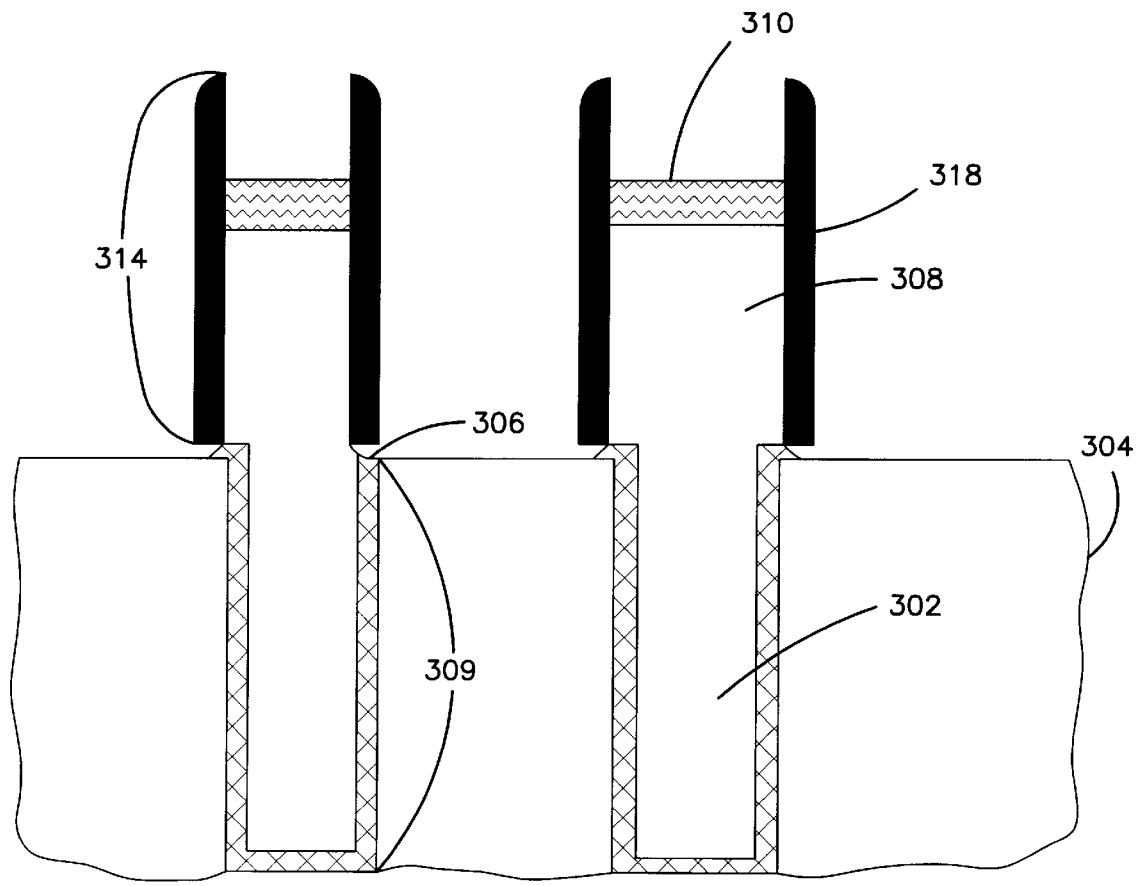
FIG. 3 is a cross-section of another example embodiment of the process step illustrated in FIG. 1F.

In some embodiments, illustrated in FIG. 3, the removal of the barrier layer 306 is allowed to proceed so that those portions of the barrier layer 306 beneath the spacer structures 318 are also removed. A portion of the conductive structure which extends beyond the device layer 304 and adjacent to the conductive structures 314 (formed from the metal layer 308 and ARC layer 310) may also be removed in this procedure as depicted by the opening above the ARC layer 310 in FIG. 3.

Returning to FIGS. 1A–1H, the spacers 118 are subsequently removed, as shown in FIG. 1G. The removal of the spacer structures may be accomplished by a variety of techniques including, for example, selective etching and/or ashing. If the spacers 118 are made using an oxide or nitride material, then the spacers are typically removed using a selective etching process. If the spacers 118 are made using a photoresist material then the spacers 118 may be removed by ashing because many photoresist materials are organic compounds.

Figure 1G:
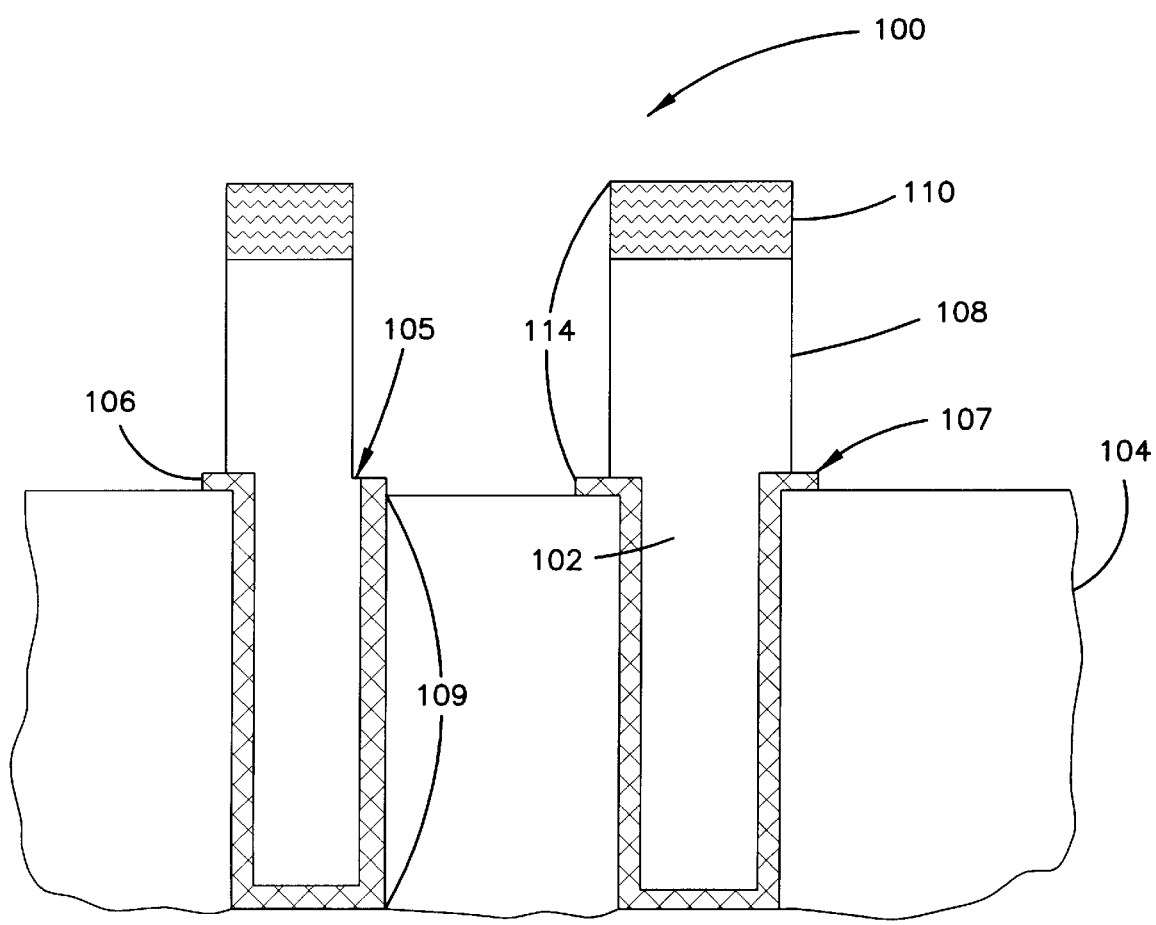
Figure 1H:
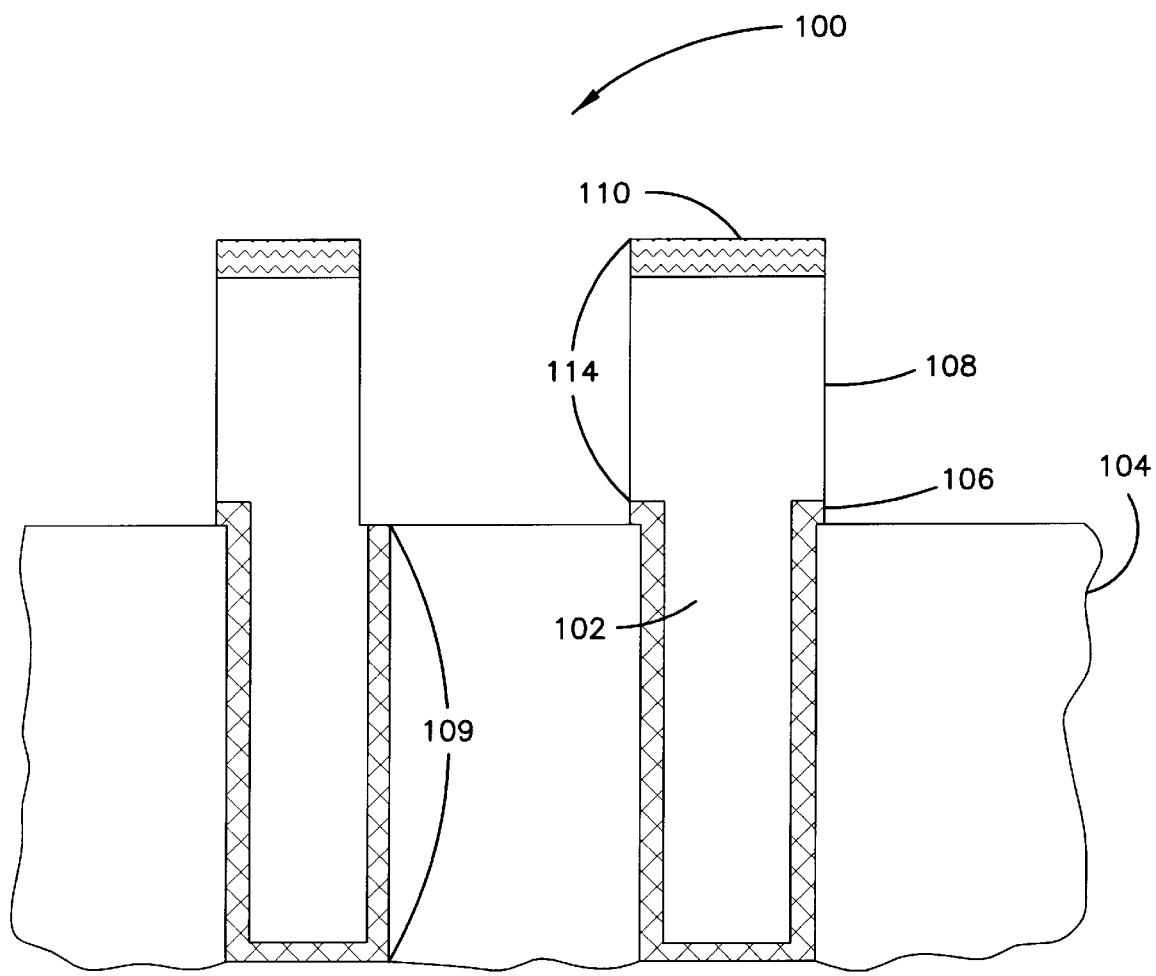

Removal of the spacers 118 may leave a portion 107 of the barrier layer 106 exposed, as shown in FIG. 1G. This portion 107 was protected from removal by the spacers 118. Optionally, this portion 107 of the barrier layer 106 may be removed by, for example, a timed etching process in which the semiconductor device 100 is exposed to an etchant for a period of time sufficient to remove some or all of the portion 107, as depicted in FIG. 1H. In some embodiments, this etchant is selective to the material of the device layer 104 or etches the material of the barrier layer 106 at a faster rate than the material of the device layer 104.

A portion 105 (see FIG. 1G) of the via structure 109 which extends above the device layer may be optionally removed during the same or a different timed etching process, as shown in FIG. 1H. In this embodiment, the etchant may etch the metal layer 108 and barrier layer 106 at similar rates.

The via structures 109 obtained as a result of the above-described process are formed in such a way as to avoid or reduce the appearance of recesses within the via structure. Accordingly, the present invention is applicable to semiconductor devices which have metal interconnects. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification. The claims are intended to cover such modifications and devices.

We claim:

1. A method for producing a semiconductor device, the method comprising:

providing a via in a device layer of the semiconductor device and a barrier layer over the device layer;

providing a metal layer over the barrier layer in the via extending above and laterally beyond the via and thereby forming a via structure, wherein the metal layer is contiguously formed in a single deposition step;

removing a portion of the metal layer, a remaining portion of the metal layer forming a conductive structure having a sidewall extending from a surface of the barrier layer;

forming a spacer along the sidewall of the conductive structure; and removing a portion of the barrier layer using the spacer to protect the via structure adjacent the surface of the device layer and removing at least a portion of the spacer.

2. The method of claim 1, wherein the barrier layer is formed subsequent to the via.

3. The method of claim 1, wherein the via has a sidewall and a bottom surface and the barrier layer is over the device layer and on the sidewall and the bottom surface of the via.

4. The method of claim 1, wherein the barrier layer comprises a conductive material.

5. The method of claim 1, wherein the device layer comprises a dielectric material.

6. The method of claim 1, wherein the metal layer comprises a metallic material, the metallic material being aluminum, copper, tungsten, or alloys thereof.

7. The method of claim 6, wherein the metal layer comprises an aluminum alloy.

8. The method of claim 7, wherein the aluminum alloy comprises an aluminum/copper alloy.

9. The method of claim 1, further comprising forming an anti-reflective coating layer over the metal layer.

10. The method of claim 9, wherein the anti-reflective coating layer comprises a conductive material.

11. The method of claim 9, wherein the anti-reflective coating layer is formed prior to removing a portion of the metal layer.

12. The method of claim 9, wherein removing a portion of the metal layer to expose the barrier layer according to a pattern comprises
forming a photoresist layer over the anti-reflective coating layer,
forming the pattern in the photoresist layer, and
removing a portion of the photoresist layer, the anti-reflective coating layer, and the metal layer, a remaining portion of the anti-reflective coating layer and the metal layer forming the conductive structure.

13. The method of claim 1, wherein the conductive structure is formed directly over the via structure.

14. The method of claim 1, wherein the conductive structure is formed offset from, but overlapping with, the via structure.

15. The method of claim 1, further comprising removing a second portion of the metal layer adjacent to the conductive structure and overlying the via structure.

16. The method of claim 1, wherein removing a portion of the metal layer comprises removing a portion of the metal layer to expose the barrier layer.

17. The method of claim 1, wherein removing a portion of the barrier layer comprises removing a portion of the barrier layer to expose the device layer.

18. A method for producing a semiconductor device, the method comprising:
providing a via in a device layer of the semiconductor device and a barrier layer over the device layer;
providing a metal layer over the barrier layer in the via extending above and laterally beyond the via and thereby forming a via structure, wherein the metal layer is contiguously formed in a single deposition step;
removing a portion of the metal layer, a remaining portion of the metal layer forming a conductive structure having a sidewall extending from a surface of the barrier layer;
forming a spacer along the sidewall of the conductive structure;
removing a portion of the barrier layer using the spacer to protect the via structure adjacent the surface of the device layer and removing at least a portion of the spacer; and
removing a second portion of the barrier layer adjacent to the conductive structure and underlying the spacer.

19. A method for producing a semiconductor device, the method comprising:
providing a via in a device layer of the semiconductor device and a barrier layer over the device layer;
providing a metal layer over the barrier layer in the via extending above and laterally beyond the via and thereby forming a via structure, wherein the metal layer is contiguously formed in a single deposition step;
removing a portion of the metal layer, a remaining portion of the metal layer forming a conductive structure having a sidewall extending from a surface of the barrier layer;
forming a spacer along the sidewall of the conductive structure;
removing a portion of the barrier layer using the spacer to protect the via structure adjacent the surface of the device layer and removing at least a portion of the spacer; and
removing the spacer.

20. A method for producing a semiconductor device, comprising:
etching a via in a dielectric layer of the semiconductor device, the via having a sidewall and a bottom surface;
depositing a barrier layer on the surface of the dielectric layer and on the sidewall and the bottom surface of the via;
forming a metal layer over the barrier layer extending above and laterally beyond the via, the metal layer filling the via to form a via structure, wherein the metal layer is contiguously formed in a single deposition step;
forming an anti-reflective coating layer over the metal layer;
forming a photoresist layer over the anti-reflective coating layer;
patterning the photoresist layer according to a pattern;
removing portions of the anti-reflective coating layer and the metal layer to expose the barrier layer according to the pattern, a remainder of the anti-reflective coating layer and the metal layer forming a conductive structure having a sidewall extending from a surface of the barrier layer;
covering the conductive structure and the barrier layer with a spacer material;
etching the spacer material to expose the barrier layer, a remainder of the spacer material forming a spacer on the sidewall of the conductive structure;
removing a portion of the barrier layer adjacent to at least one of the conductive structure and the via structure, while using the spacer to protect the via structure adjacent the surface of the device layer; and
removing at least a portion of the spacer.

21. The method of claim 20, wherein the method further comprises removing the entire spacer.

22. The method of claim 21, further comprising removing a second portion of the metal layer adjacent to the conductive structure and overlying the via structure.

23. A method for producing a semiconductor device, comprising:
etching a via in a dielectric layer of the semiconductor device, the via having a sidewall and a bottom surface;
depositing a barrier layer on the surface of the dielectric layer and on the sidewall and the bottom surface of the via;
forming a metal layer over the barrier layer extending above and laterally beyond the via, the metal layer filling the via to form a via structure, wherein the metal layer is contiguously formed in a single deposition step;
forming an anti-reflective coating layer over the metal layer;
forming a photoresist layer over the anti-reflective coating layer;
patterning the photoresist layer according to a pattern;

removing portions of the anti-reflective coating layer and the metal layer to expose the barrier layer according to the pattern, a remainder of the anti-reflective coating layer and the metal layer forming a conductive structure having a sidewall extending from a surface of the barrier layer;

covering the conductive structure and the barrier layer with a spacer material;

etching the spacer material to expose the barrier layer, a remainder of the spacer material forming a spacer on the sidewall of the conductive structure;

removing a portion of the barrier layer adjacent to at least one of the conductive structure and the via structure, while using the spacer to protect the via structure adjacent the surface of the device layer;

removing at least a portion of the spacer; and removing a portion of the barrier layer comprises removing a portion of the barrier layer adjacent to the conductive structure and the via structure and underlying the spacer structure.

* * * * *

UNITED STATES PATENT AND TRADEMARK OFFICE
CERTIFICATE OF CORRECTION

PATENT NO.    : 6,228,757 B1                                        Page 1 of 1
DATED         : January 30, 2002
INVENTOR(S)   : Sengupta et al.

It is certified that error appears in the above-identified patent and that said Letters Patent is hereby corrected as shown below:

<u>Column 10,</u>
Line 42, "device" should read -- dielectric --.

<u>Column 12,</u>
Line 4, "device" should read -- dielectric --.

Signed and Sealed this

Twentieth Day of August, 2002

Attest:

Attesting Officer

JAMES E. ROGAN
*Director of the United States Patent and Trademark Office*